(12) United States Patent
Bonaccio et al.

(10) Patent No.: US 9,384,792 B2
(45) Date of Patent: Jul. 5, 2016

(54) OFFSET-CANCELLING SELF-REFERENCE STT-MRAM SENSE AMPLIFIER

(71) Applicant: GLOBALFOUNDRIES INC., Grand Cayman, KY (US)

(72) Inventors: Anthony R. Bonaccio, Shelburne, VT (US); John K. DeBrosse, Colchester, VT (US); Thomas M. Maffitt, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/580,589

(22) Filed: Dec. 23, 2014

(65) Prior Publication Data

US 2015/0294706 A1   Oct. 15, 2015

Related U.S. Application Data

(60) Provisional application No. 61/977,194, filed on Apr. 9, 2014.

(51) Int. Cl.
*G11C 7/02* (2006.01)
*G11C 7/06* (2006.01)
*G11C 11/16* (2006.01)
*G11C 29/02* (2006.01)

(52) U.S. Cl.
CPC ............. *G11C 7/065* (2013.01); *G11C 7/062* (2013.01); *G11C 11/1673* (2013.01); *G11C 29/026* (2013.01); *G11C 29/028* (2013.01)

(58) Field of Classification Search
CPC .......... G11C 7/062; G11C 7/06; G11C 7/065; G11C 7/14; G11C 7/08; G11C 16/28; G11C 11/1673; G11C 11/5642

USPC ........... 365/207, 205, 210.1, 189.011, 189.14
See application file for complete search history.

(56) References Cited

U.S. PATENT DOCUMENTS

| | | | |
|---|---|---|---|
| 5,237,533 | A | 8/1993 | Papaliolios |
| 5,508,958 | A | 4/1996 | Fazio et al. |
| 5,751,635 | A | 5/1998 | Wong et al. |
| 5,880,988 | A | 3/1999 | Bertin et al. |
| 6,094,394 | A | 7/2000 | La Rosa |
| 6,185,143 | B1 | 2/2001 | Perner et al. |
| 6,269,040 | B1 | 7/2001 | Reohr et al. |

(Continued)

OTHER PUBLICATIONS

Razavi, Behzad et al., "Design Techniques for High-Speed, High-Resolution Comparators", IEEE Journal of Solid-State Circuits, vol. 27, No. 12, 1992, pp. 1916-1926.

(Continued)

*Primary Examiner* — David Lam
(74) *Attorney, Agent, or Firm* — Thompson Hine LLP (57) ABSTRACT

Embodiments are directed to a self-reference STT-MRAM sensing scheme that uses offset-cancellation to reduce the impact of FET mismatch and thereby allow the sensing of lower read voltages. In some embodiments, the sensing scheme includes a differential amplifier having a first input connected to a memory cell. In some embodiments, a second input of the differential amplifier may be connected to ground, a common mode voltage of the system or a mid-level supply voltage. The present disclosure provides flexibility with respect to the voltage level at which the sensing is performed (e.g., ground, Voc, Vmid, etc.). The present disclosure provides further flexibility with respect to the sense voltage polarity.

10 Claims, 10 Drawing Sheets

(56) References Cited

U.S. PATENT DOCUMENTS

| | | | |
|---|---|---|---|
| 6,317,356 | B1 | 11/2001 | Hoffmann et al. |
| 6,396,733 | B1 | 5/2002 | Lu et al. |
| 6,462,981 | B2 | 10/2002 | Numata et al. |
| 6,590,805 | B2 | 7/2003 | Lu et al. |
| 6,600,690 | B1 | 7/2003 | Nahas et al. |
| 6,693,826 | B1 | 2/2004 | Black, Jr. et al. |
| 6,816,403 | B1 | 11/2004 | Brennan et al. |
| 6,870,760 | B2 | 3/2005 | Tsang |
| 6,917,534 | B2 | 7/2005 | Baker |
| 7,002,865 | B2* | 2/2006 | Agata ............... G11C 16/0425 365/185.27 |
| 7,095,667 | B2* | 8/2006 | Baker ..................... G11C 7/02 327/124 |
| 7,236,415 | B2* | 6/2007 | Forbes .................. G11C 7/062 365/189.15 |
| 7,239,537 | B2 | 7/2007 | Debrosse et al. |
| 7,345,512 | B2 | 3/2008 | Tran et al. |
| 7,366,021 | B2 | 4/2008 | Taylor et al. |
| 7,453,751 | B2 | 11/2008 | Forbes et al. |
| 7,701,763 | B2 | 4/2010 | Roohparvar |
| 7,764,536 | B2 | 7/2010 | Luo et al. |
| 7,787,319 | B2 | 8/2010 | Graber |
| 8,116,122 | B2 | 2/2012 | Li et al. |
| 8,482,950 | B2 | 7/2013 | Kitagawa et al. |
| 8,773,887 | B1* | 7/2014 | Naji .................... G11C 11/165 365/148 |
| 2004/0120200 | A1 | 6/2004 | Gogl et al. |
| 2004/0264249 | A1 | 12/2004 | Ho et al. |
| 2006/0067149 | A1 | 3/2006 | Shimizu et al. |
| 2007/0258301 | A1 | 11/2007 | Del Gatto |
| 2008/0285360 | A1 | 11/2008 | Sakimura et al. |
| 2009/0027811 | A1 | 1/2009 | Guo et al. |
| 2014/0153313 | A1 | 6/2014 | Boujamaa et al. |

OTHER PUBLICATIONS

Zhang, Ruili et al., "Windowed MRAM Sensing Scheme", IEEE International Workshop on Memory Technology, Design and Testing, 2000, pp. 47-55.

DeBrosse, J., "Mismatch and Noise Insensitive STT MRAM," Related U.S. Appl. No. 14/629,875, filed Feb. 24, 2015.

Debrosse, J., "STT-MRAM Sensing Technique," Related U.S. Appl. No. 14/484,742, filed Sep. 12, 2014.

List of IBM Patents or Patent Applications Treated as Related; Mar. 5, 2015; pp. 1-2.

\* cited by examiner

OFFSET-CANCELLING SELF-REFERENCE STT-MRAM SENSE AMPLIFIER

DOMESTIC PRIORITY

The present application claims priority to U.S. provisional patent application Ser. No. 61/977,194, titled "OFFSET-CANCELLING, SELF-REFERENCE STT-MRAM SENSE AMPLIFIER," filed Apr. 9, 2014, assigned to the assignee hereof and expressly incorporated by reference herein.

BACKGROUND

The present disclosure relates generally to electronic memory technology, and more specifically to sensing low voltage signals of a spin torque transfer magnetic random access memory (STT-MRAM).

STT-MRAM is an attractive emerging memory technology, offering non-volatility, high performance and high endurance. A typical STT-MRAM memory cell includes a magnetic tunnel junction (MTJ) in series with a field effect transistor (FET), which is gated by a word line (WL). A bit line (BL) and a source line (SL) run parallel to each other and perpendicular to the WL. The BL is connected to the MTJ, and the SL is connected to the FET. One memory cell along the BL is selected by turning on its WL. When a relatively large voltage (e.g., 500 mV) is forced across the cell from BL to SL, the selected cell's MTJ is written into a particular state, which is determined by the polarity of this voltage.

When the cell is in a logic "0" or parallel state, its MTJ resistance is lower than when the cell is in a logic "1" or anti-parallel state. Typical MTJ resistance values would include $R_0=10\Omega$ and $R_1=20$ K$\Omega$. A selected cell is read by sensing the resistance from BL to SL. The "sense" or "read" voltage must be much lower than the write voltage in order to clearly distinguish write and read operations, and to avoid inadvertently disturbing the cell during a read operation. Thus, there is a need for sense amplifier (SA) designs capable of sensing very low read voltage (e.g., less than 50 mV).

However, random device variations (e.g., dimensions and other parameters) can lead to corresponding variations in $R_0$ and $R_1$. For very small MTJs, the actual distributions of $R_0$ and $R_1$ for a particular device may in practice overlap, although $R_1$ is in theory expected to be greater than $R_0$. In this case, it is impossible to use the same reference resistance to discriminate a logic 0 from a logic 1 for all bits. In a proposed solution, known as self-referencing, the data state resistance is sensed and stored, the cell is written to a known reference state, then the reference state resistance is sensed. Based on a change in resistance (from data to reference), or a lack thereof, the original data state can be determined.

Random device variations can also lead to variations in the threshold voltage and trans-conductance of silicon FETs, even for devices in close proximity. This effect, known generally as FET mismatch, results in random offsets in various circuits, particularly those circuits that include FET configurations such as amplifiers and comparators. Thus, FET mismatch can determine the lower limit for its read voltage. For example, using a standard amplifier/latch configuration, assume that the read voltages for logic 0 and logic 1 are 50 mV and 100 mV, respectively. In this case, the optimal voltage at the reference input of the latch is 75 mV, and the nominal signal (i.e., reference voltage minus data voltage) is approximately 25 mV, with the polarity depending on the data state. If the offset of the latch varies randomly by as much as 25 mV due to FET mismatch, there is zero margin (i.e., nominal signal minus variation) in the worst case. Increasing the read voltages would increase the margin, however the lack of margin prevents the read voltages from being lowered.

Offset-cancellation is a technique used in analog circuit designs to minimize the effects of FET mismatch. In a typical offset-cancellation technique applied to an amplifier circuit, during a first phase the amplifier offset is determined and stored on one or more capacitors. The circuit is then reconfigured, and during the second phase the capacitors act to cancel out the amplifier offset, ideally resulting in zero offset. In reality, some offset still remains but has been significantly reduced.

Thus, there is a need for an STT-MRAM sensing scheme capable of reducing the impact of random device variations to thereby sense very low read voltages.

BRIEF SUMMARY

Embodiments are directed to a sense amplifier comprising: a first differential amplifier including a first input, a second input, a first output and a first voltage offset; wherein said first input is coupled to a memory cell: said memory cell including a read state, a write state and a data state; and read/write circuitry coupled to said memory cell and capable of reading or writing said data state of said memory cell: wherein said first differential amplifier senses said data state by sensing a difference between said first input and said second input, canceling said first voltage offset and amplifying said difference.

Embodiments are directed to a method of sensing a data state of a memory cell comprising: reading a data state of the memory cell; writing said data state of the memory cell to a first reference state and a second reference state; and reading said second reference state of the cell; wherein the memory cell is coupled to a first input of a first differential amplifier having a first voltage offset, and wherein said first differential amplifier senses the data state by sensing a difference between said first input and said second input, canceling said first voltage offset and amplifying said difference.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

Figure 1:
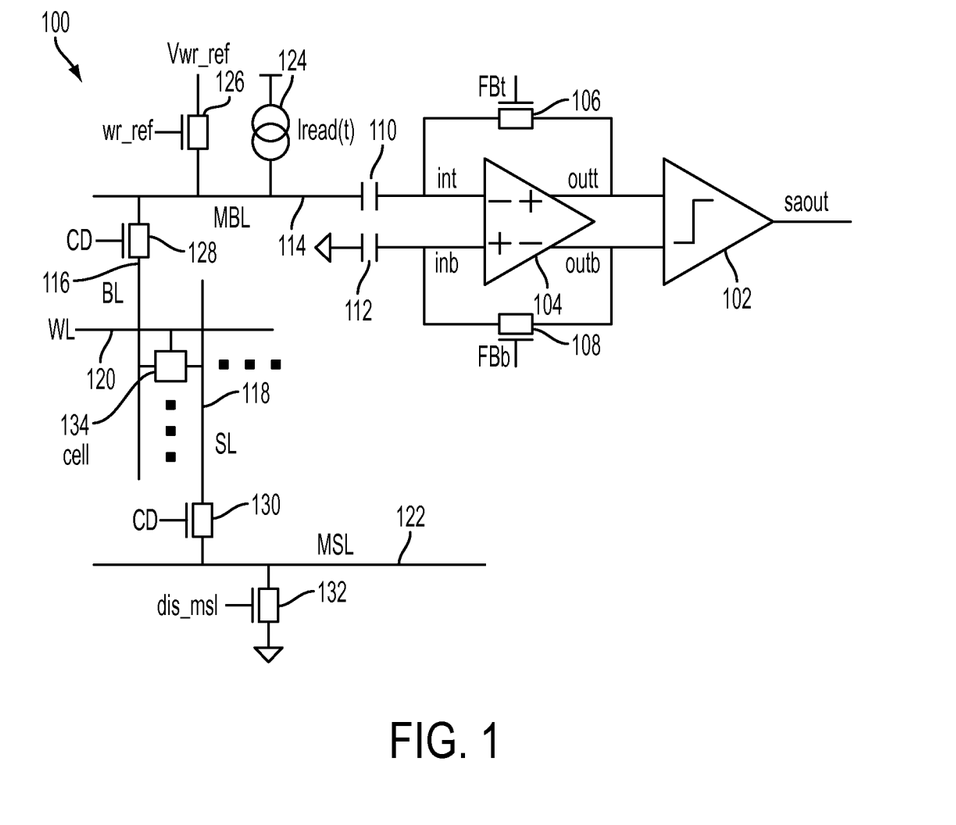
FIG. 1 is a schematic diagram of a sense amplifier (SA) circuit in accordance with one or more embodiments.

FIG. 1 is a schematic diagram of a sense amplifier (SA) circuit 100 in accordance with one or more embodiments. SA circuit 100 includes a comparator 102, a closed loop differential amplifier 104, a top feedback switch/transistor 106, a bottom feedback switch/transistor 108, a top capacitor 110, a bottom capacitor 112, a master bit line (MBL) 114, a bit line (BL) 116, a source line (SL) 118, a word line (WL) 120, a master source line (MSL) 122, a current source 124, a write switch/transistor 126, a BL column decoder/transistor 128, a SL column decoder/transistor 130, a MSL discharge switch/transistor 132 and a memory cell (e.g., a STT-MRAM) 134, arranged and configured as shown. SA circuit 100 in practice may be configured as an array having a plurality of individual memory cells 134, BLs 116, BL column decoders 128, SLs 118, SL column decoders 130 and WLs 120. SA circuit 100 receives and processes a variety of signals including a sense amplifier out (saout) signal, an output top (outt) signal, an output bottom (outb) signal, an input top (int) signal, an input bottom (inb) signal, a feedback top (FBt) signal, a feedback bottom (FBb) signal, a read current (Iread(t)), a write reference voltage (Vwr_ref), a write reference current (wr_ref), a column decode (CD) signal and a discharge MSL (dis-msl) signal, arranged and configured as shown.

Figure 2:
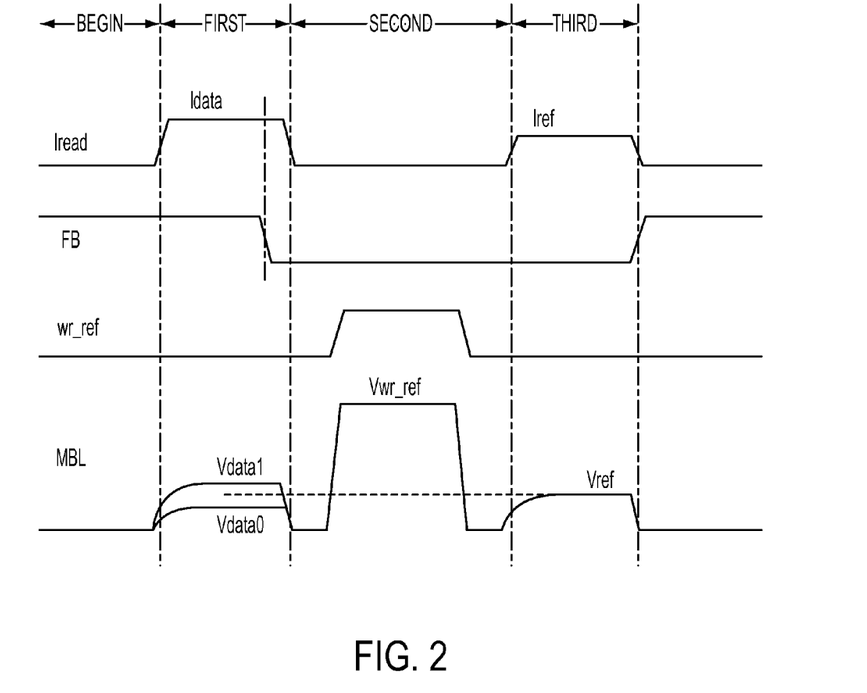
FIG. 2 is a timing diagram that illustrates some operations of the SA circuit shown in FIG. 1.
Figure 3:
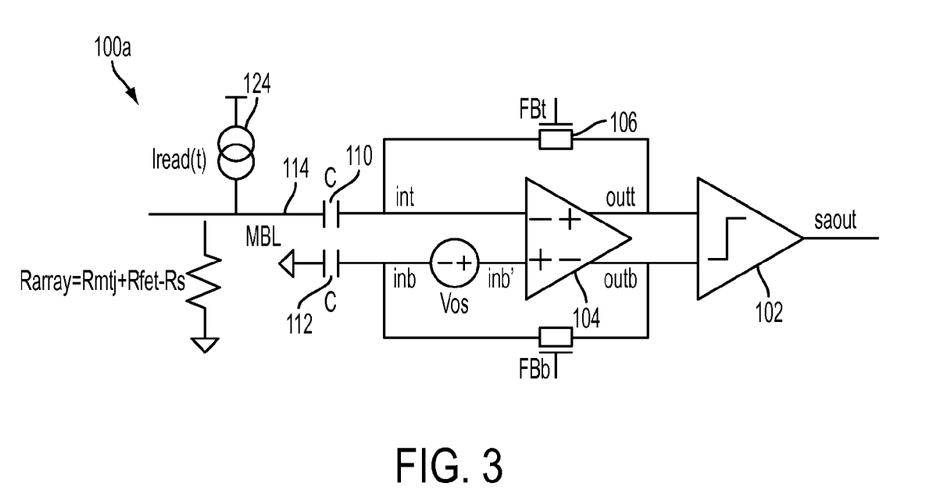
FIG. 3 is a simplified version of the SA circuit shown in FIG. 1.

To facilitate a review of certain aspects of the disclosed embodiments, FIG. 2 is a timing diagram that shows how certain signals propagate through a portion of SA circuit 100 shown in FIG. 1, and FIG. 3 illustrates a SA circuit 100a that is a simplified version of SA circuit 100 shown in FIG. 1. In SA circuit 100a, the resistance of the entire array structure (cell 134, BL 116, BL column decoder 128, SL 118, SL column decoder 130 and WL 120) is represented in FIG. 3 by an array resistor (Rarray) having a value equal to the sum of the MTJ resistance (Rmtj), the array FET resistance (Rfet, which includes BL decoder 128 and SL decoder 130) and the series resistance (Rs, which includes BL 116 and SL 118). Differential amplifier 104 in FIG. 3 is assumed to be an ideal amplifier (without offset), and a voltage source (Vos), which represents the random offset due to FET mismatch, is in series with the positive input to differential amplifier 104.

Referring collectively to FIGS. 1, 2 and 3, a read cycle of the present disclosure may be segmented into three phases. The disclosed read cycle begins by enabling WL 120, BL column decoder 128, the dis_msl signal and FB switches 106, 108. Focusing on FIGS. 2 and 3, the read cycle enters a first or "sense data" phase in which current source 124 brings the Iread(t) signal to an Idata value and forces Idata onto MBL 114 and through Rarray to ground. In response, a voltage on MBL 114 rises to one of two values, Vdata0 or Vdata1, depending on whether the data state of cell 134 is a logic 0 (Vdata0) or a logic 1 (Vdata1). When SA circuit 100 (or 100a) stabilizes, the FBt, FBb signals fall, thereby disabling the negative feedback paths (106, 108) of differential amplifier 104. Toward the end of the first phase, current source 124 returns Iread(t) to zero. The read cycle then enters a second or "write reference" phase. The wr_ref signal is enabled, thus gating supply Vwr_ref signal onto MBL 114. The Vwr_ref signal is held in place long enough to ensure that the reference state associated with Vwr_ref is written to cell 134. The read cycle then enters a third or "sense reference" phase in which current source 124 takes the Iread(t) signal to a value, Iref, and applies it onto MBL 114 and through Rarray. In response, the voltage on MBL 114 rises to Vref. Iref is preferably chosen such that Vref is approximately midway between Vdata0 and Vdata1.

Thus, from the time that the FBt, FBb signals fall (i.e., near the end of the sense data phase) to the beginning of the sense reference phase, the voltage on MBL 114 either rises by a small amount (Vdata0 to Vref) or falls by a small amount (Vdata1 to Vref). The elements of SA circuit 100 (or 100a) shown to the right of and including capacitors 110, 112 determine the polarity of this MBL voltage change and hence the original data state of cell 134. In general, an ideal, fully differential amplifier is characterized by its gain, A=Vout/Vin, and by its output common mode voltage, Voc=average (Vout+, Vout−). Referring now to FIG. 3, for differential amplifier 104 just prior to the moment that the FBt, FBb signals fall, as the gain (A) of amplifier 104 increases, Vin at the inputs of amplifier 104 must go to zero in order for Vout to remain finite. Because the feedback loops of amplifier 104 are enabled, this implies that Vout=Vos. Thus, the voltage at nodes outt and int is Voc+Vos/2, and the voltage at outb and inb is Voc−Vos/2. Following the fall of the FBt, FBb signals, nothing can change the voltage at node inb, and only voltage changes on MSL 122 can change the voltage on int. To simplify this analysis, the input capacitance of amplifier 104 is ignored, and there is assumed to be perfect capacitive coupling from MBL 114 to int. Thus, after the FBt, FBb signals fall, the voltage difference at the input of amplifier 104 is Vin=(Voc−Vos/2+Vos)−(Voc+Vos/2+Vmb1)=−Vmb1. The voltage difference at the output of amplifier 104 and at the input of comparator 102 is Vout=−A*Vmb1. Thus, the random offset voltage Vos does not appear in Vout, and the effect of Vos on Vout under the present disclosure has been eliminated.

The immediately following paragraphs provide a more detailed analysis of the signal theory and the offset cancellation theory behind the present disclosure, wherein differential amplifier 104 includes finite gain A and imperfect capacitive coupling.

Under the relevant signal theory analysis, if we assume that:

$R0' = Rmtj0 + Rfet + Rs;$ $R1' = Rmtj1 + Rfet + Rs;$ $MR' = R1'/R0' - 1;$ and $Vdisturb = R0*Idata.$ Additionally, by examination we find that:

$V\text{data}0 = R0'^* I\text{data}$;

$V\text{data}1 = R1'^* I\text{data}$;

$V\text{ref} = R1'^* I\text{ref}$;

$V\text{signal}0 = V\text{ref} - V\text{data}0 > 0$; and $V\text{signal}1 = V\text{ref} - V\text{data}1 < 0$.

For a symmetrical, nominal signal:

$\text{abs}(V\text{signal}0) = \text{abs}(V\text{signal}1)$;

$I\text{ref}/I\text{data} = \frac{1}{2}^*(1 + R0'/R1') = \frac{1}{2}^*(MR' + 2)/(MR' + 1)$; and $V\text{signal}/V\text{disturb} = \frac{1}{2}^*(R1/R0 - 1) = \frac{1}{2}^* MR$ (independent of $R\text{fet}$ or $Rs$).

Under the relevant offset cancellation theory, we can assume that:

$V\text{out}t = V\text{oc} + \frac{1}{2}^* A^*(V\text{inb} + V\text{os} - V\text{int})$; and $V\text{out}b = V\text{oc} - \frac{1}{2}^* A^*(V\text{inb} + V\text{os} - V\text{int})$.

Thus, when FB switches 106, 108 are on during the first or sense data phase:

$V\text{int} = V\text{out}t, V\text{inb} = V\text{out}b$;

$V\text{int} + V\text{inb} = 2^* V\text{oc}$;

$V\text{int} - V\text{inb} = V\text{os}^* A/(A+1) = V\text{os}'$;

$V\text{int} = V\text{oc} + \frac{1}{2}^* V\text{os}'$;

$V\text{inb} = V\text{oc} - \frac{1}{2}^* V\text{os}'$; and $V\text{inb}' = V\text{oc} - \frac{1}{2}^* V\text{os}' + V\text{os}$.

After FB switches 106, 108 are off during the second or write reference phase:

$DV\text{out} = V\text{out}t - V\text{out}b = A^*(V\text{inb}' - V\text{int})$;

$DV\text{out} = A^*[(V\text{oc} - \frac{1}{2}^* V\text{os}' + V\text{os}) - (V\text{oc} + \frac{1}{2}^* V\text{os}' + DV\text{mb}1^* CCR)]$;

$DV\text{out} = A^*[V\text{os} - V\text{os}' - DV\text{mb}1^* CCR]$;

$DV\text{out} = A^*[V\text{os}/(A+1) - DV\text{mb}1^* CCR]$;

$DV\text{mb}1 = V\text{mbl\_ref} - V\text{mbl\_data}$;

$CCR = C/(C + C\text{intp})$; and $C\text{intp}$ = parasitic capacitance on node int.

Thus, as shown by the above analysis, the impact of the offset is not completely eliminated but is reduced by a factor of $1/(A+1)$, which nonetheless represents a very significant improvement. Hence, the present disclosure provides a high gain amplification of the MBL voltage change that is substantially immune to FET mismatch-driven amplifier offset.

Figure 4:
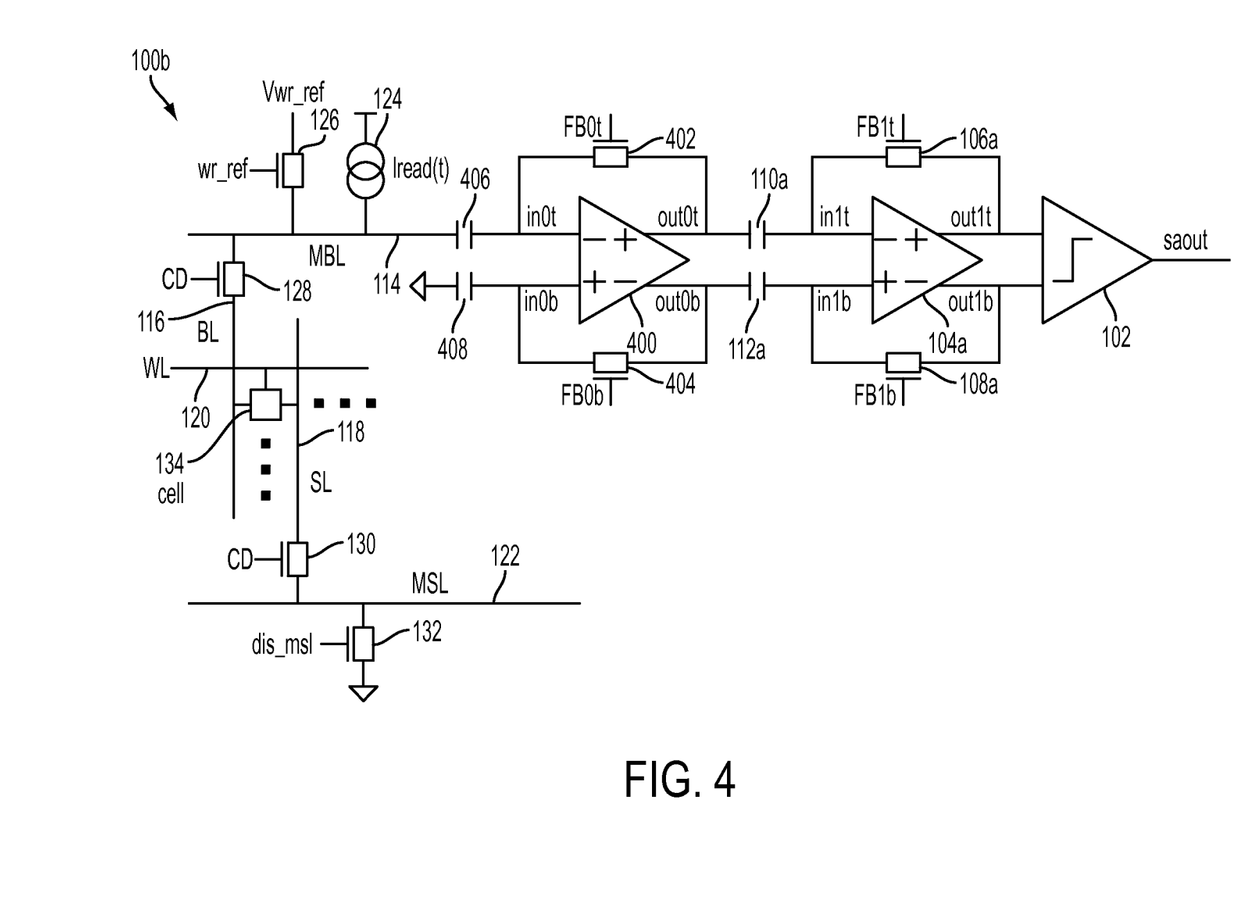
FIG. 4 is a schematic diagram illustrating a two stage SA circuit embodiment.

FIG. 4 illustrates another SA circuit 100b of the present disclosure. SA circuit 100b is identical to SA circuit 100 of FIG. 1 except the differential amplifier is provided in two stages by a first closed loop differential amplifier 104a, a first top feedback switch/transistor (FB1t) 106a, a first bottom feedback switch/transistor (FB1b) 108a, a first top capacitor 110a, a second bottom capacitor 112a, a second closed loop differential amplifier 400, a second top feedback switch/transistor (FB0t) 402, a second bottom feedback switch/transistor (FB0b) 404 and a second top capacitor 406, configured and arranged as shown. Second closed loop amplifier 400 provide additional gain to further amplify Vmbl. This additional gain/amplification can counter any offsets contributed by comparator 102.

Figure 5:
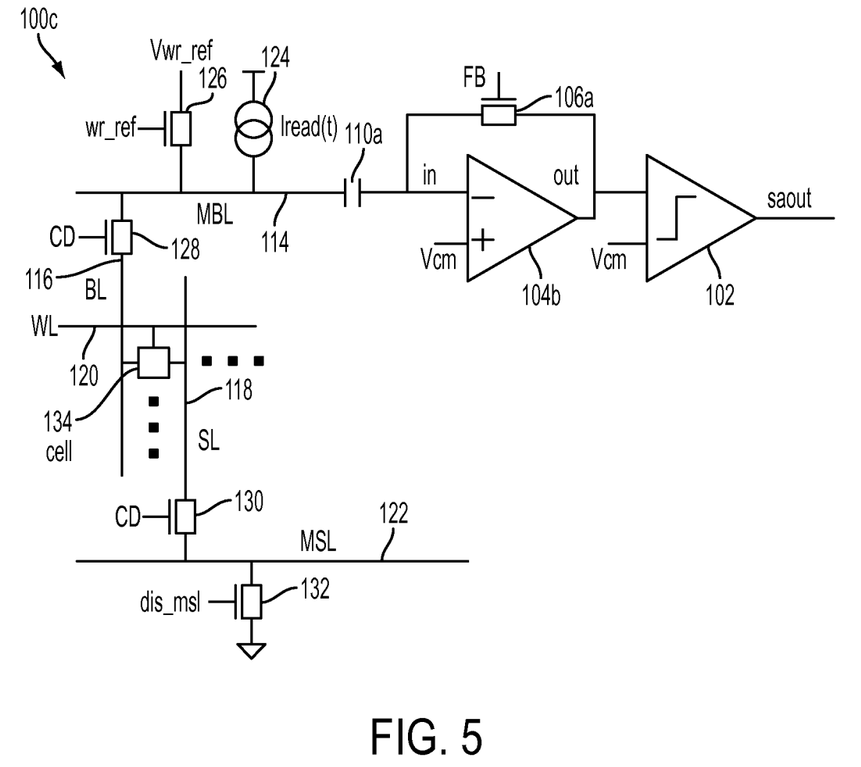
FIG. 5 is schematic diagram illustrating a single ended SA circuit embodiment.

FIG. 5 illustrates another SA circuit 100c of the present disclosure. SA circuit 100c is identical to SA circuit 100 of FIG. 1 except that fully differential amplifier 104 is replaced by a single ended differential amplifier 104b. In SA circuit 100c, the lower input of single ended differential amplifier 104b and comparator 102 are held to Vcm, which is the desired common mode voltage of the overall system.

Figure 6:
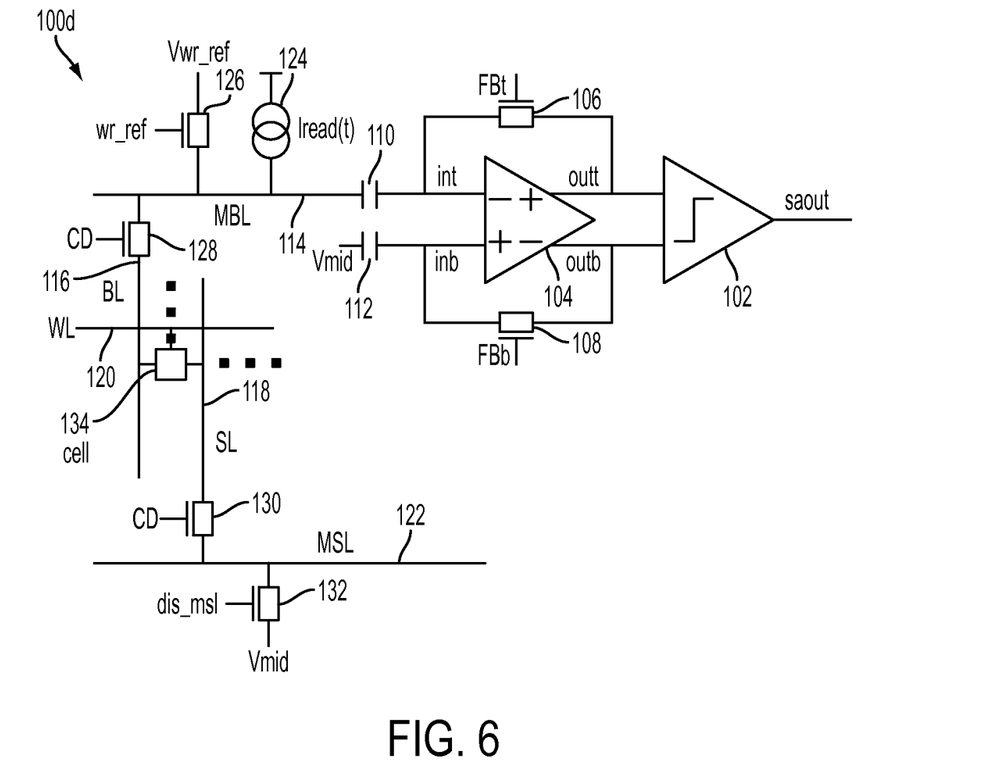
FIG. 6 is schematic diagram illustrating a Vmid SA circuit embodiment.

FIG. 6 illustrates another SA circuit 100d of the present disclosure. SA circuit 100d is identical to SA circuit 100 of FIG. 1 except the left terminal of bottom capacitor 112 is connected to Vmid, and MSL 122 is discharged to Vmid. For several reasons, including the reduction of array FET gate oxide stress, it may be desirable to perform the sensing operations near Vmid, which is a mid-level supply (e.g., approximately 500 mV). Coupling the left terminal of bottom capacitor 112 to Vmid is not strictly required for functionality but provides better immunity to Vmid noise.

Figure 7:
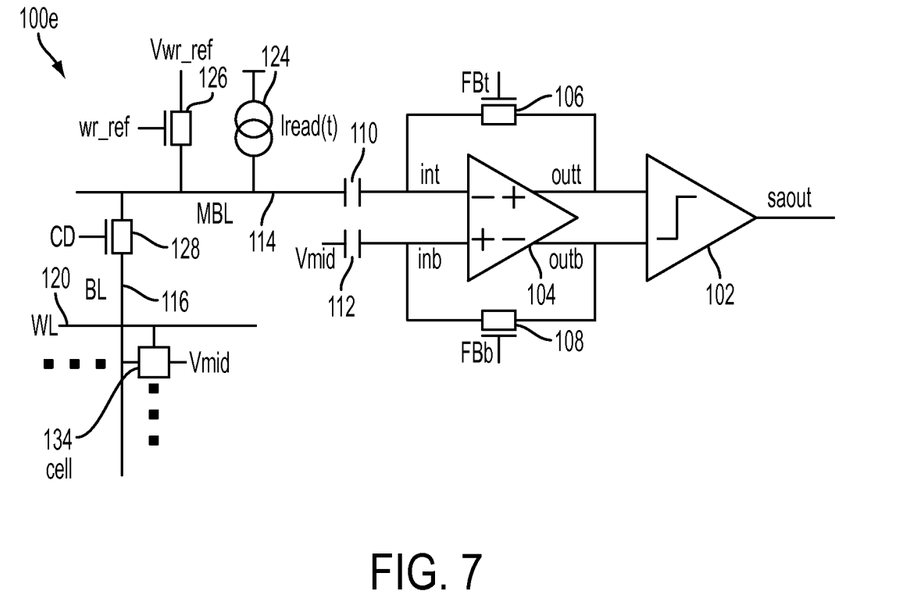
FIG. 7 is a schematic diagram illustrating a merged SL, SA circuit embodiment.

FIG. 7 illustrates another SA circuit 100e of the present disclosure. SA circuit 100e is identical to SA circuit 100d of FIG. 6 except the density of the SA circuit array is improved by changing the SL connections. Instead of having individual SLs for each column, the SL connections of all memory cells in SA circuit 100e are merged together, as a mesh for example. This merged SL (not shown) is preferably connected to a mid-level supply (Vmid, at approximately 500 mV) in order to allow writing of both a logic 0 and a logic 1 data state. Similar to SA circuit 100d of FIG. 6, the left terminal of bottom capacitor 112 is preferably connected to Vmid to improve the immunity to Vmid noise.

As previously described, the sense or read voltage must be sufficiently less than the write voltage to avoid disturbing the data state of the cell during a read operation. Thus, the sense voltage polarity has a significant impact on whether the sense voltage disturbs the cell. If the sensing voltage applied to the cell and the write reference voltage applied to the cell are of the same polarity, the possibility of disturbing the cell's data state during the sense reference phase is eliminated. Although it would still be possible for the sense reference current pulse to disturb the cell into the reference state, the cell would already be in the reference state due to the previous write reference phase.

The likelihood of a sense voltage disturbing the cell's data state can be further reduced by the choice of the reference state. The most likely scenario for disturbing the cell data state is when the cell was originally in the non-reference state. If the cell was originally in the reference state, the sense data current pulse cannot disturb it. If it is assumed that the read voltages for logic 0 and logic 1 are 50 mV and 100 mV, respectively, and if the reference state is chosen to be logic 0, the relevant disturb voltage is the read voltage for logic 1 (100 mV). However, if the reference state is chosen to be logic 1, the relevant disturb voltage is the read voltage for logic 0 (50 mV). In order to minimize the magnitude of the disturb voltage, a reference state of logic 1 is preferred.

Figure 8:
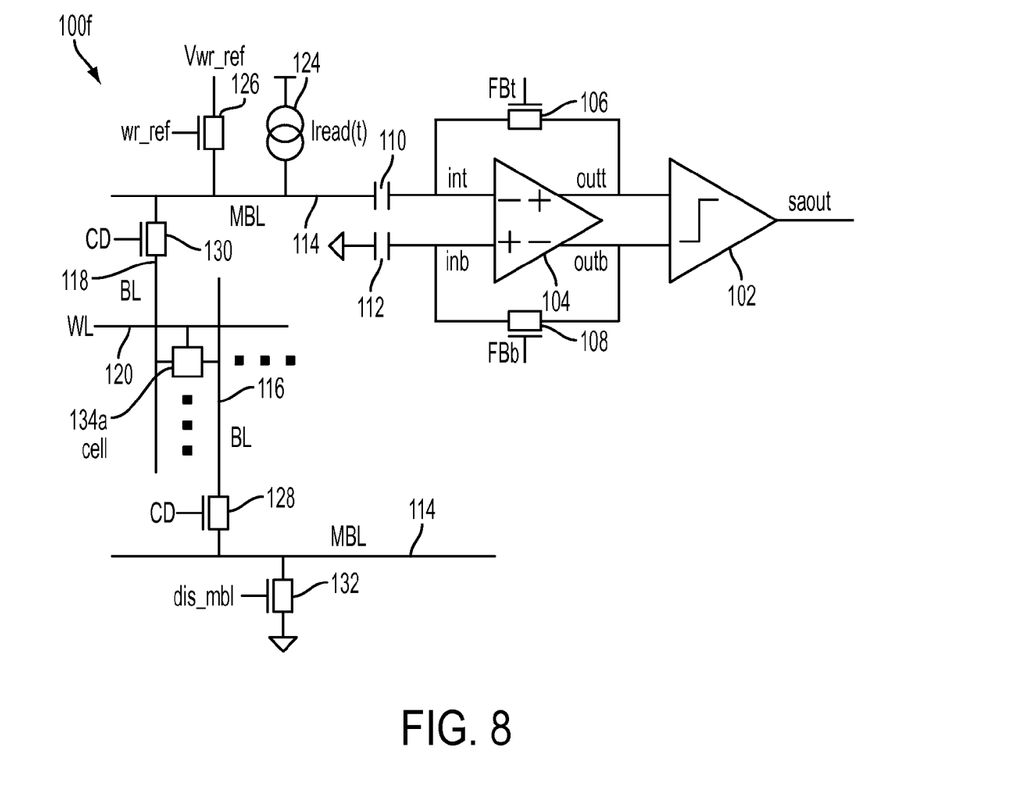
FIG. 8 is a schematic diagram illustrating a reversed MBL/MSL SA circuit embodiment.
Figure 9:
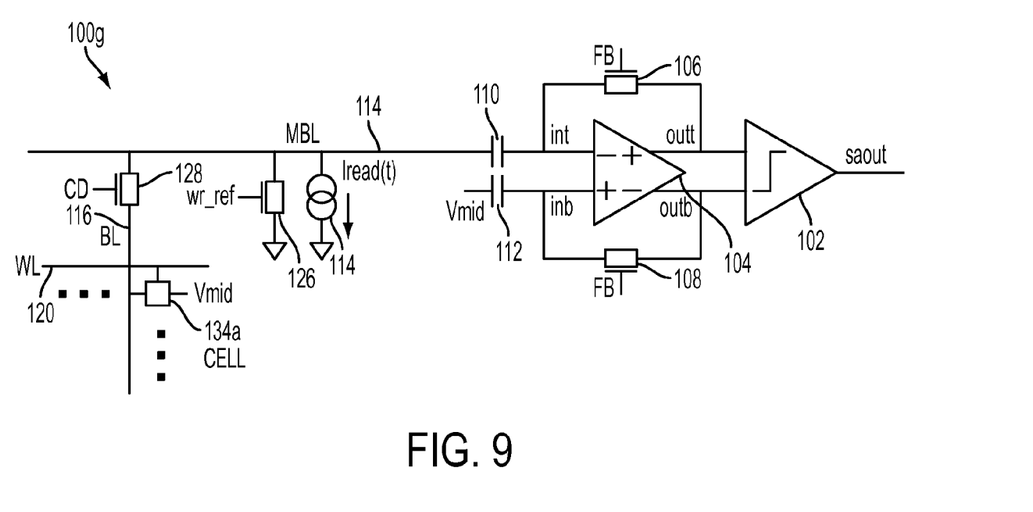
FIG. 9 is a schematic diagram illustrating a merged SL, reversed polarity SA circuit embodiment.

Thus, a reference state of logic 1 and a sense voltage polarity equal to the write reference voltage polarity is preferred. The polarity of the write logic 1 voltage depends on the structure of the cell's MTJ. If the free layer of the cell's MTJ is above the fixed layer, the write logic 1 current polarity is up. If the free layer is below the fixed layer, the write logic 1 current polarity is down. Hence, to provide the greatest flexibility, it is important that a sensing scheme support either read voltage polarity. For the SA circuits shown in FIGS. 1-7, it is assumed that the free layer is below the fixed layer, thus Iread(t) forces current down through cell 134, from BL 116 to SL 118. FIGS. 8 and 9 assume that the cell's free layer is above the cell's fixed layer, thus Iread(t) forces current up through a cell 134a from SL 118 to BL 116.

Thus, FIG. 8 illustrates another SA circuit 100f of the present disclosure. SA circuit 100f is identical to SA circuit 100 of FIG. 1 except that SA circuit 100f is moved from MBL 114 to MSL 122 to thereby reverse the polarity of the sensing voltage applied to cell 134a.

FIG. 9 illustrates another SA circuit 100g of the present disclosure. SA circuit 100g is identical to SA circuit 100e of FIG. 7 except that the polarity of Iread(t) is reversed in order to sink current from MBL 114. To maintain consistency between the sense voltage polarity and the write reference voltage polarity, wr_ref signal gates ground onto MBL 114. Vmid determines the magnitude of the write reference voltage in SA circuit 100g.

Figure 10:
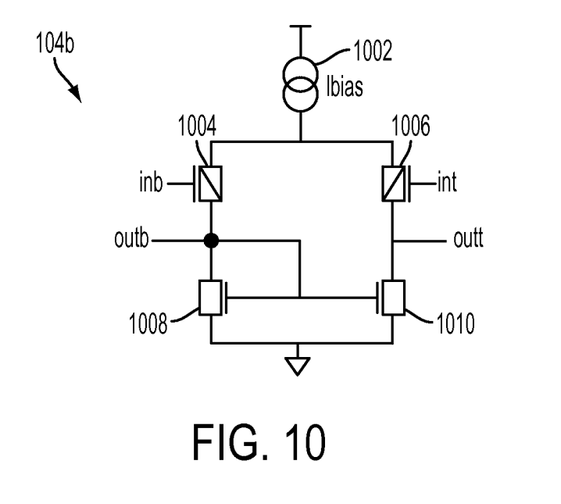
FIG. 10 is an example of a suitable differential amplifier configuration.

FIG. 10 illustrates an example of a differential amplifier 104b that may be used as closed loop differential amplifiers 104, 104a, 400 shown in FIGS. 1-9. Differential amplifier 104b includes a bias current source 10002, a first NFET 1004, a second NFET 1006, a first FET 1008 and a second FET 1010, configured and arranged as shown. Although the outputs (outt, outb) are not perfectly symmetrical because the NFET gates are tied to node outb, a simple differential amplifier design (104b) of the type shown provides suitable performance.

Thus, the present disclosure provides a self-reference memory cell (e.g., STT-MRAM) sensing scheme that uses offset-cancellation to reduce the impact of FET mismatch and thereby allow the sensing of lower read voltages. In some embodiments, the sensing scheme includes a differential amplifier having a first input connected to a memory cell. In some embodiments, a second input of the differential amplifier may be connected to ground, a common mode voltage of the system or a mid-level supply voltage. The present disclosure provides flexibility with respect to the voltage level at which the sensing is performed (e.g., ground, Voc, Vmid, etc.). The present disclosure provides further flexibility with respect to the sense voltage polarity.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A sense amplifier comprising:
 a first differential amplifier including a first input, a second input, a first output and a first voltage offset;
 wherein said first input is coupled to a memory cell via a first capacitive element;
 wherein said second input is coupled to ground via a second capacitive element;
 wherein said first output of said differential amplifier is coupled to a comparator via a second differential amplifier including a third input, a fourth input, a second output and a second voltage offset;
 said memory cell including a read state, a write state and a data state; and
 read/write circuitry coupled to said memory cell and capable of reading or writing said data state of said memory cell;
 wherein said read/write circuitry further comprises:
 a sense data phase wherein said read/write circuitry reads said data state;
 a write reference phase wherein said read/write circuitry writes said data state to a first reference state and a second reference state; and
 a sense reference phase wherein said read/write circuitry reads said second reference state;
 wherein said first differential amplifier senses said data state by sensing a first difference between said first input and said second input, canceling said first voltage offset and amplifying said first difference;
 wherein said first differential amplifier senses a second difference between said data state and said second reference state to thereby determine a polarity of said data state;
 wherein said third input is coupled to said first output of said first differential amplifier, and said fourth input is coupled to said second output of said first differential amplifier;
 wherein said third input is coupled to said first output of said first differential amplifier via said second capacitive element;
 wherein said fourth input is coupled to said second output of said first differential amplifier via a third capacitive element; and
 wherein said second differential amplifier cancels said second offset voltage and further amplifies said second difference.

2. The sense amplifier of claim 1 wherein said first differential amplifier comprises a closed loop.

3. The sense amplifier of claim 1 wherein said second input of said first differential amplifier is coupled to a common mode voltage.

4. The sense amplifier of claim 1 wherein said second input of said first differential amplifier is coupled to a mid-level supply voltage.

5. The sense amplifier of claim 1 wherein said memory cell comprises a spin transfer torque magnetic random access memory (STT-MRAM).

6. A method of sensing a data state of a memory cell, the method comprising:
reading a data state of the memory cell;
writing said data state of the memory cell to a first reference state and a second reference state; and
reading said second reference state of the cell;
wherein the memory cell is coupled to a first input of a first differential amplifier having a first voltage offset, and wherein said first differential amplifier senses the data state by sensing a first difference between said first input and said second input, canceling said first voltage offset and amplifying said first difference;
wherein said first input of said first differential amplifier is coupled to said memory cell via a first capacitive element;
wherein said second input of said first differential amplifier is coupled to a ground via a second capacitive element;
wherein said first differential amplifier senses a second difference between said data state and said second reference state to thereby determine a polarity of said data state;
wherein said first differential amplifier comprises a closed loop;
wherein said first output of said first differential amplifier is coupled to a comparator;
wherein said first output of said first differential amplifier is coupled to said comparator via a second differential amplifier including a third input, a fourth input, a second output, and a second voltage offset;
wherein said third input is coupled to said first output of said first differential amplifier;
wherein said fourth input is coupled to said second output of said first differential amplifier;
wherein said third input is coupled to said first output of said first differential amplifier via said second capacitive element;
wherein said fourth input is coupled to said second output of said first differential amplifier via a third capacitive element; and
wherein said second differential amplifier cancels said second offset voltage and further amplifies said second difference.

7. The method of claim 6 wherein said second input of said first differential amplifier is coupled to a common mode voltage.

8. The method of claim 6 wherein said second input of said first differential amplifier is coupled to a mid-level supply voltage.

9. The method of claim 6 wherein the memory cell comprises a spin transfer torque magnetic random access memory (STT-MRAM).

10. The method of claim 9 wherein said STT-RAM comprises a mesh configuration.

* * * * *